US010347730B2

(12) United States Patent
Bian

(10) Patent No.: US 10,347,730 B2
(45) Date of Patent: Jul. 9, 2019

(54) TRENCH GATE STRUCTURE AND MANUFACTURING METHOD THEREFOR

(71) Applicant: CSMC TECHNOLOGIES FAB2 CO., LTD., Jiangsu (CN)

(72) Inventor: Zheng Bian, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 16/064,550

(22) PCT Filed: Apr. 27, 2017

(86) PCT No.: PCT/CN2017/082123
§ 371 (c)(1),
(2) Date: Jun. 21, 2018

(87) PCT Pub. No.: WO2017/219755
PCT Pub. Date: Dec. 28, 2017

(65) Prior Publication Data
US 2018/0374925 A1 Dec. 27, 2018

(30) Foreign Application Priority Data
Jun. 22, 2016 (CN) .......................... 2016 1 0457601

(51) Int. Cl.
*H01L 29/423* (2006.01)
*H01L 29/78* (2006.01)
(Continued)

(52) U.S. Cl.
CPC ...... *H01L 29/4236* (2013.01); *H01L 21/0337* (2013.01); *H01L 21/76897* (2013.01);
(Continued)

(58) Field of Classification Search
CPC .......... H01L 29/4236; H01L 29/42364; H01L 29/66704; H01L 29/66734; H01L 29/7813; H01L 21/0337; H01L 29/76897
See application file for complete search history.

(56) References Cited

U.S. PATENT DOCUMENTS 7,211,860 B2 * 5/2007 Zundel .............. H01L 29/42368
257/330
7,419,878 B2 * 9/2008 Williams ............ H01L 29/4236
438/270

(Continued)

FOREIGN PATENT DOCUMENTS

| CN | 102184862 A | 9/2011 |
| CN | 105576025 A | 5/2016 |

OTHER PUBLICATIONS

International Search Report with English translation dated Jul. 28, 2017 issued in the corresponding International Application No. PCT/CN2017/082123, pp. 1-8.

*Primary Examiner* — Sitaramarao S Yechuri
(74) *Attorney, Agent, or Firm* — Polsinelli PC

(57) ABSTRACT

A trench gate structure and a manufacturing method therefor. The trench structure comprises a substrate (10), a trench on the surface of the substrate (10), an insulating spacer (20) on the substrate (10), a gate oxide layer (41) on the inner surface of the trench, and a polysilicon gate (40) on the gate oxide layer (41). The insulating spacer (20) abuts against the trench by means of a slope structure (21) of the insulating spacer; the polysilicon gate (40) extends onto the insulating spacer (20) along the slope structure (21) in the trench; the insulating spacer (20) comprises a polysilicon gate pull-up area (22) that is concave downwards with respect to other parts of the insulating spacer (20); the polysilicon gate (40) extending out of the trench is rested on the polysilicon gate pull-up area (22).

10 Claims, 18 Drawing Sheets

(51) Int. Cl.
  *H01L 29/66* (2006.01)
  *H01L 21/768* (2006.01)
  *H01L 21/033* (2006.01)
(52) U.S. Cl.
  CPC .. *H01L 29/42364* (2013.01); *H01L 29/66704* (2013.01); *H01L 29/66734* (2013.01); *H01L 29/7813* (2013.01); *H01L 29/7825* (2013.01)

(56) References Cited

U.S. PATENT DOCUMENTS

| | | | |
|---|---|---|---|
| 9,391,193 B2* | 7/2016 | Yedinak | H01L 29/0692 |
| 2002/0030237 A1* | 3/2002 | Omura | H01L 29/8725 257/397 |
| 2003/0127702 A1* | 7/2003 | Blair | H01L 21/76229 257/510 |
| 2004/0183136 A1* | 9/2004 | Williams | H01L 29/4236 257/369 |
| 2009/0065858 A1 | 3/2009 | Kim | |
| 2010/0123188 A1* | 5/2010 | Venkatraman | H01L 29/407 257/330 |
| 2011/0204436 A1* | 8/2011 | Kraft | H01L 21/823437 257/330 |
| 2012/0007173 A1* | 1/2012 | Yamamoto | H01L 29/0634 257/330 |
| 2015/0028412 A1* | 1/2015 | Schulze | H01L 27/0207 257/330 |
| 2016/0351703 A1* | 12/2016 | Matsuura | H01L 29/78 |

\* cited by examiner

TRENCH GATE STRUCTURE AND MANUFACTURING METHOD THEREFOR

CROSS REFERENCE TO RELATED APPLICATIONS

This application is a National Phase filing under 35 U.S.C. § 371 of PCT/CN2017/082123 filed on Apr. 27, 2017, and this application claims priority to Chinese Application No. 201610457601.4 filed on Jun. 22, 2016, under 35 U.S.C. § 119. The entire contents of each application are hereby incorporated by reference in its entirety.

TECHNICAL FIELD

The present disclosure relates to semiconductor manufacturing technology, and particularly relates to a trench gate structure, and further relates to a method of manufacturing a trench gate structure.

BACKGROUND

Due to cost reasons, a conventional vertically double diffused metal-oxide-semiconductor field-effect transistor (VDMOS) product has an end portion size with enlarged lead-out trenches, and the trench gate is led out by punching a contact hole thereon. The advantage of the solution is that it can use the existing mask layers of the product process, without increasing the cost of mask layers. However, the disadvantage is that the solution is limited by the processes of the trench depth, the polysilicon thickness, and the contact hole depth, therefore the application of this conventional solution is limited.

SUMMARY

Accordingly, it is necessary to provide a trench gate structure with a relatively higher design flexibility and a manufacturing method thereof.

A method of manufacturing a trench gate structure includes: forming an insulating pad on a surface of a substrate, and the insulating pad forms a slope structure at an end thereof; forming a hard mask on surfaces of the substrate and insulating pad; performing lithography using a photoresist to form a polysilicon gate opening; etching an exposed hard mask by the opening, wherein the insulating pad forms a polysilicon gate pull-up area corresponding to the opening due to an over-etching of the hard mask, and the polysilicon gate pull-up area is recessed with respect to other portions of the insulating pad; etching an exposed substrate by the opening to form a trench; wherein the insulating pad is adjacent to the trench by the slope structure thereof; performing a gate oxide oxidation, forming a gate oxide layer on an inner surface of the trench; depositing polysilicon in the trench, forming a polysilicon gate, wherein the polysilicon gate extends from an inside of the trench to the polysilicon gate pull-up area and serves as an area contacting a contact hole; and peeling off the hard mask.

In the aforementioned method of manufacturing a trench gate structure, a portion of the polysilicon gate that located on the insulating pad serves as a position contacting a contact hole (i.e. serves as a trench gate lead-out structure), therefore the insulating pad below the contact hole can serve as a barrier layer for contact hole etching, so that the problem of reducing the size of the process opening to avoid leakage caused by contact hole penetrating the polysilicon is erased. The polysilicon gate in the trench and the polysilicon gate extending to the insulating pad are independent to each other, therefore neither the depth of trench and the depth of contact hole will limit each other, nor the thickness of polysilicon in the trench and the thickness of polysilicon contacted with the field oxide will limit each other, making the design of the trench gate more flexible and facilitating online control. On the other hand, the lithography of the polysilicon gate and the lithography of the polysilicon of the device are performed in a same step, no extra lithography mask or lithography layer is required, therefore the cost from this aspect is not increased.

BRIEF DESCRIPTION OF THE DRAWINGS

Further objects, characteristics and advantages of present disclosure will become apparent from the detailed description of preferred embodiments illustrated in accompanying drawings. The use of the same reference numbers in different instances in the drawings may indicate identical items, and the drawings are not intended to be drawn to scale, with emphasis on illustrating the subject matter of the present disclosure.

DETAILED DESCRIPTION OF THE EMBODIMENTS

Embodiments of the present disclosure are described more fully hereinafter with reference to the accompanying drawings. A preferred embodiment is described in the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure. As used herein, the term "and/or" includes any and all combinations of one or more of the associated listed items.

It will be understood that when an element is referred to as being "fixed" to another element, it can be directly fixed to the other element or intervening elements may be present. Also, when an element is referred to as being "connected" or "coupled" to another element, it can be directly connected or coupled to the other element or intervening elements may be present. As used herein, the terms "vertical", "horizontal", "up", "down", "left", "right" and the like are merely for the illustrative purpose.

Figure 2:
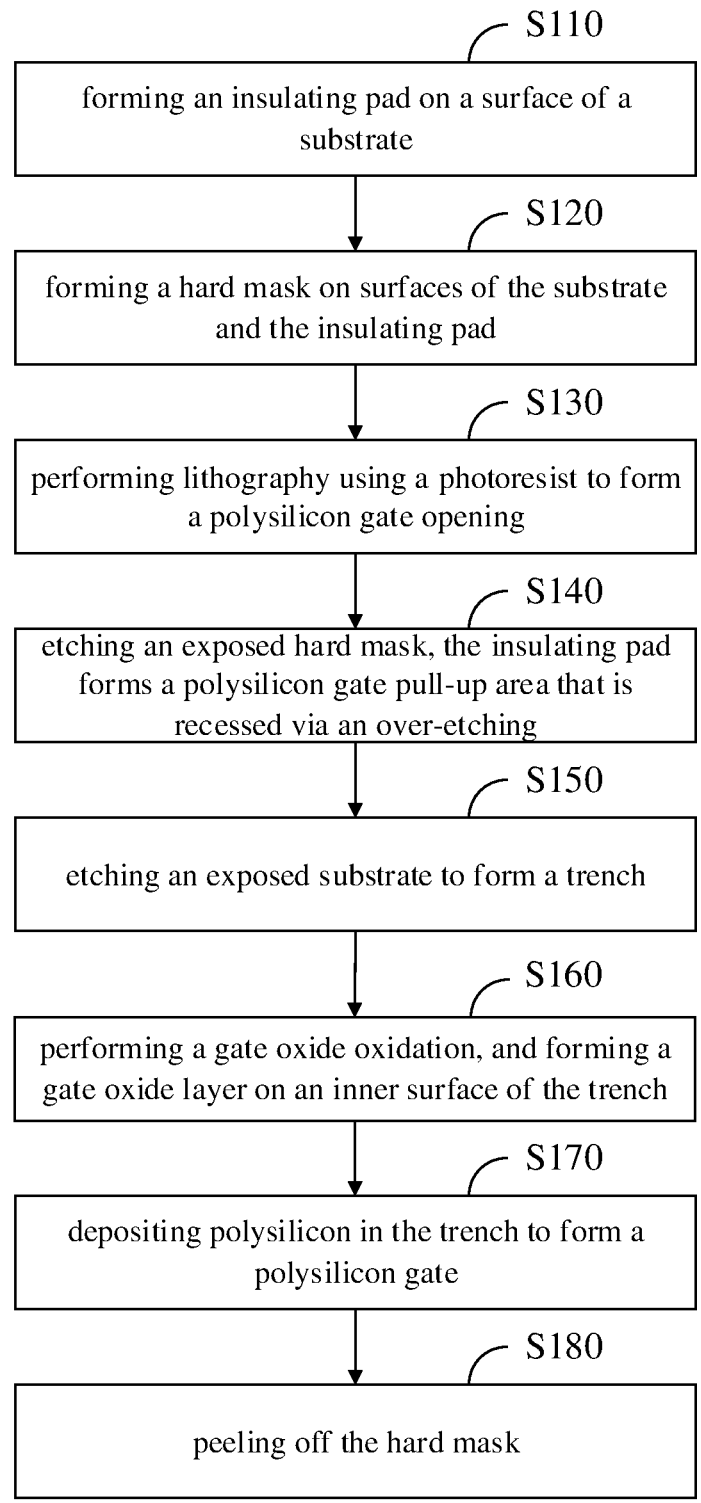
FIG. 2 is a flow chart of a method of manufacturing a trench gate structure according to an embodiment.

FIG. 2 is a flow chart of a method of manufacturing a trench gate structure according to an embodiment, which includes the following steps:

In S110, an insulating pad is formed on a surface of a substrate.

Figure 3A:
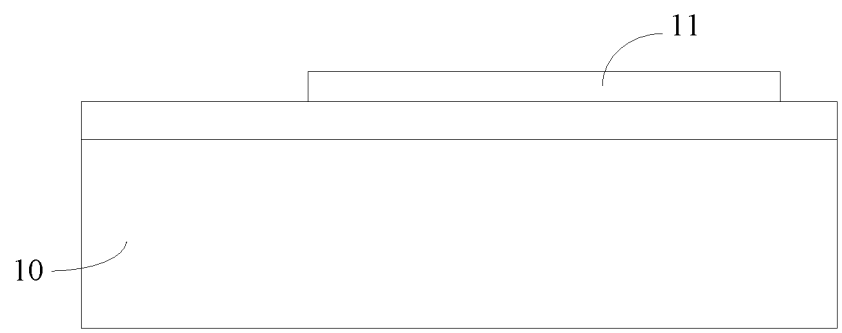
FIG. 3a to FIG. 3o are schematic views of a device during a manufacturing process according to the method of manufacturing the trench gate structure in FIG. 2.
Figure 3B:
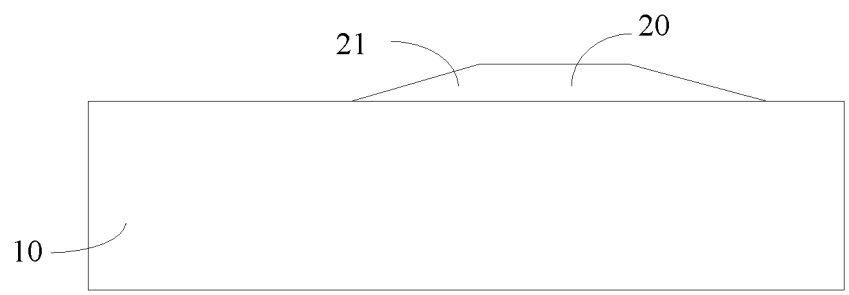

Referring to FIG. 3b, an end of the insulating pad 20 adjacent to the trench is a slope structure 21, such that the polysilicon gate is pulled up from an inside of the trench onto the insulating pad 20. In the illustrated embodiment, the insulating pad 20 is a field oxide layer. Referring to FIG. 3a, after growing the field oxide layer on the substrate 10, the insulating pad 20 is formed by performing an active area lithography and a wet etching using a photoresist 11.

In S120, a hard mask is formed on surfaces of the substrate and the insulating pad.

The hard mask 30 is formed by depositing. In the illustrated embodiment, the hard mask 30 is made of silicon nitride, and other hard masks known in the art can also be used in other embodiments.

In S130, lithography is performed using a photoresist to form a polysilicon gate opening.

Figure 3C:
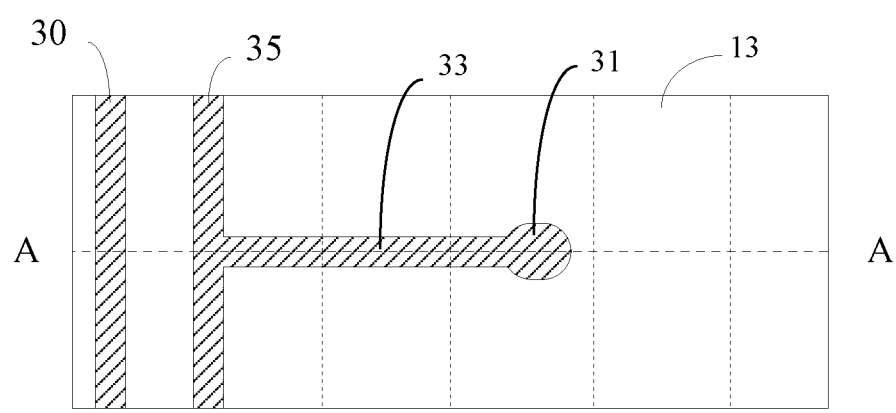
Figure 3D:
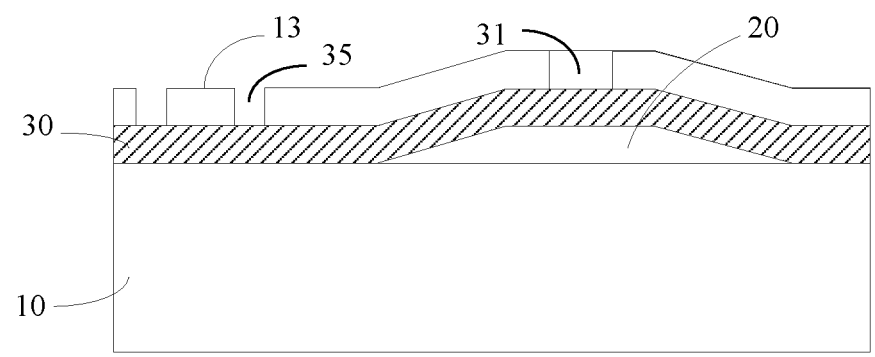

FIG. 3c is a top plan view of the device after step S130, and FIG. 3d is a cross-sectional view of the device taken along the AA line in FIG. 3c. The photoresist 13 forms a polysilicon gate opening after being photoetched, and the hard mask 30 below the polysilicon gate opening is exposed. The broken lines perpendicular to the AA line represent the outlines of the hard mask 30 below the photoresist 13.

In the illustrated embodiment, the polysilicon gate opening includes a metal plug contact opening 31 used for forming a portion where the polysilicon gate contacts the metal plug, a main body opening 35 used for forming a main body of the polysilicon gate, and a connecting opening 33 connecting the metal plug contact opening 31 and the main body opening 35. In the illustrated embodiment, the connecting opening 33 is rectangular and perpendicular to the main body opening 35. The main body opening 35 can be in a reseau shape or other shapes, so as to achieve an interconnection between the polysilicon gates of DMOS cell area. It should be understood that, since only part of the device is shown in the accompanying drawings, only partial area of the main body opening 35 is shown in FIG. 3c.

In S140, an exposed hard mask is etched, and a polysilicon gate pull-up area that is recessed is formed on the insulating pad due to an over-etching.

Figure 3E:
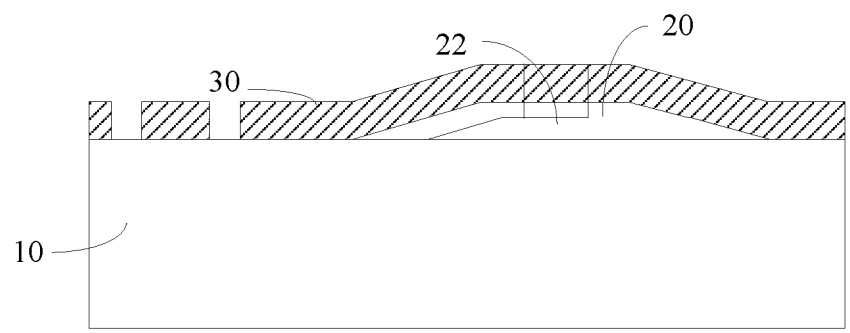

Referring to FIG. 3e, in the step of performing an etching and removing the photoresist, portion of the insulating pad 20 is also etched during the hard mask etching, therefore a recessed polysilicon gate pull-up area 22 will be formed on the insulating pad 20 below the polysilicon gate opening, and a subsequently formed polysilicon gate can extend from an inside of a trench along the polysilicon gate pull-up area 22 onto the insulating pad 20.

In S150, an exposed substrate is etched to form a trench.

The substrate below the polysilicon gate opening is etched to form the trench 12. Due to the blocking effect of the insulating pad 20 to the etching, the trench 12 is adjacent to the slope structure 21 of the insulating pad 20.

In S160, a gate oxide oxidation performed, and a gate oxide layer is formed on an inner surface of the trench.

Figure 3F:
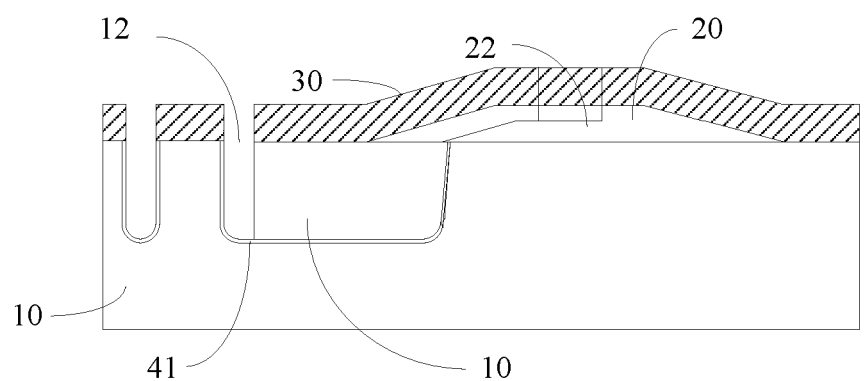

Referring to FIG. 3f, the silicon on the inner surface of the trench 12 is oxidized to form a gate oxide layer 41.

In S170, polysilicon is deposited in the trench to form a polysilicon gate.

Figure 3G:
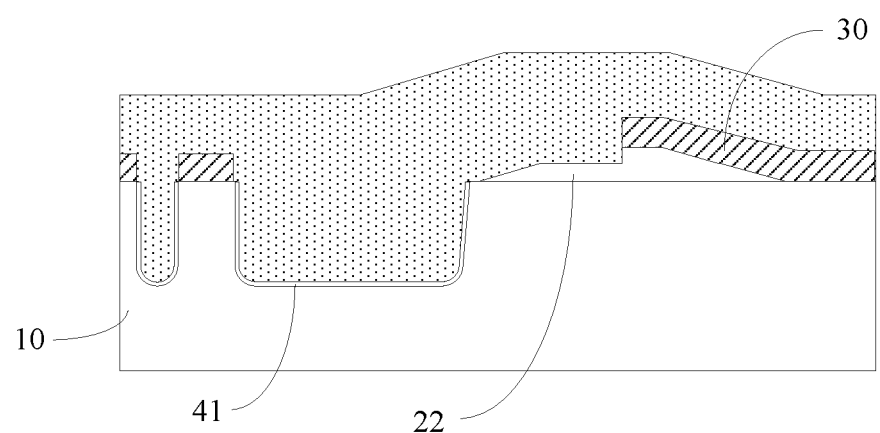
Figure 3H:
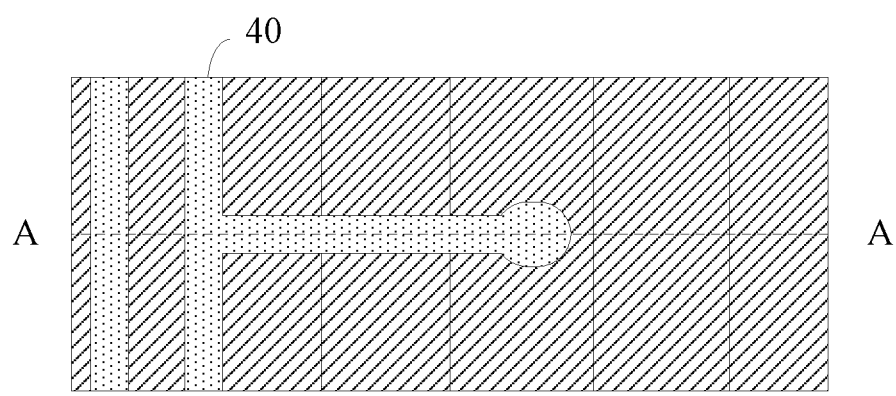
Figure 3I:
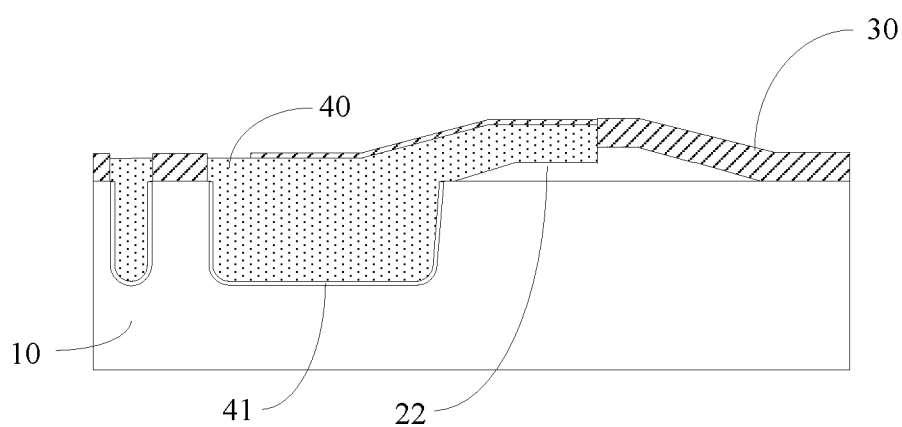

Referring to FIG. 3g, FIG. 3h, and FIG. 3i, in the illustrated embodiment, the polysilicon is etched back after being deposited, the redundant polysilicon is removed, and the polysilicon gate 40 is formed. FIG. 3h is a top plan view of the device after the step S170, and FIG. 3i is a cross-sectional view taken along the AA line in FIG. 3h. The polysilicon gate 40 extends from the inside of the trench along the slope structure 21 onto the polysilicon gate pull-up area 22, and a portion on the polysilicon gate pull-up area 22 (i.e. a gate lead-out structure) serves as an area for punching a contact hole.

In S180, the hard mask is peeled off.

Figure 3J:
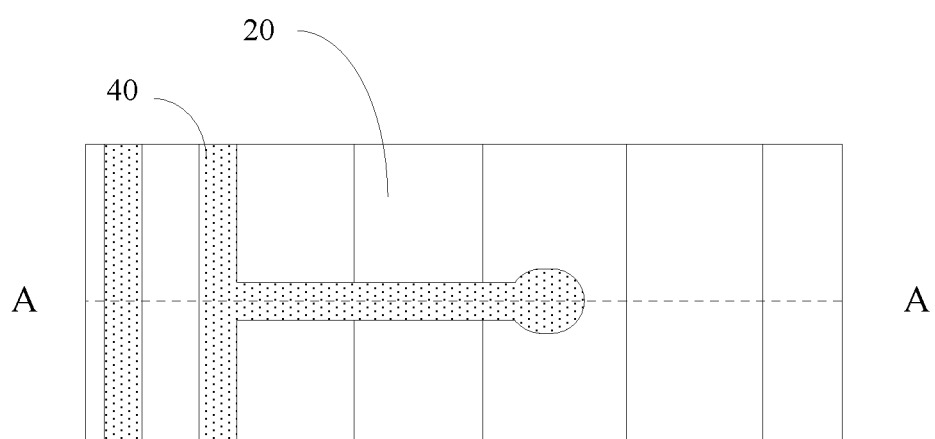
Figure 3K:
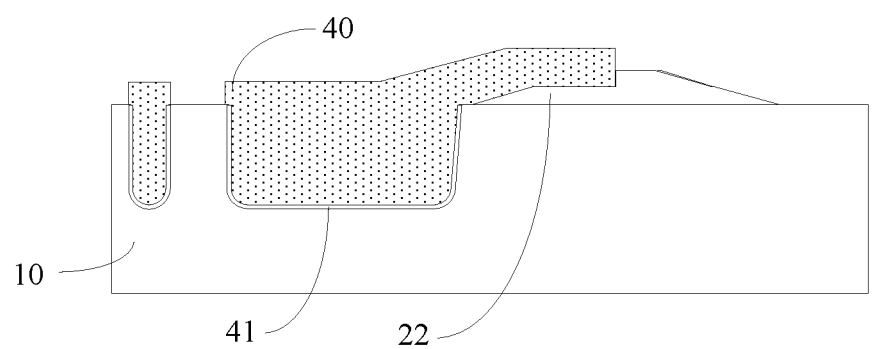

The hard mask 30 is peeled off. FIG. 3j is a top plan view of the device after the step S180, and FIG. 3k is a cross-sectional view taken along the AA line in FIG. 3j. The underlying insulating pad 20 is exposed when the hard mask 30 is peeled off.

In the aforementioned method of manufacturing a trench gate structure, a portion of the polysilicon gate 40 that located on the insulating pad 20 serves as a position contacting the contact hole (i.e. serving as a trench gate lead-out structure), therefore the insulating pad 20 below the contact hole can serve as a barrier layer for contact hole etching, so that the problem of the process opening is addressed. The portion of the polysilicon gate 40 in the trench and the portion of the polysilicon gate 40 extending to the insulating pad 20 are independent to each other, therefore the depth of the trench and the depth of the contact hole (and a corresponding thickness of the polysilicon) will not limit each other, which makes the design of the trench gate more flexible and facilitating online control.

On the other hand, the lithography of the polysilicon gate 40 (i.e. step S130) and the polysilicon lithography are performed in the same step, and no extra lithography mask or lithography layer is required, therefore the cost from this aspect is not increased.

Figure 4:
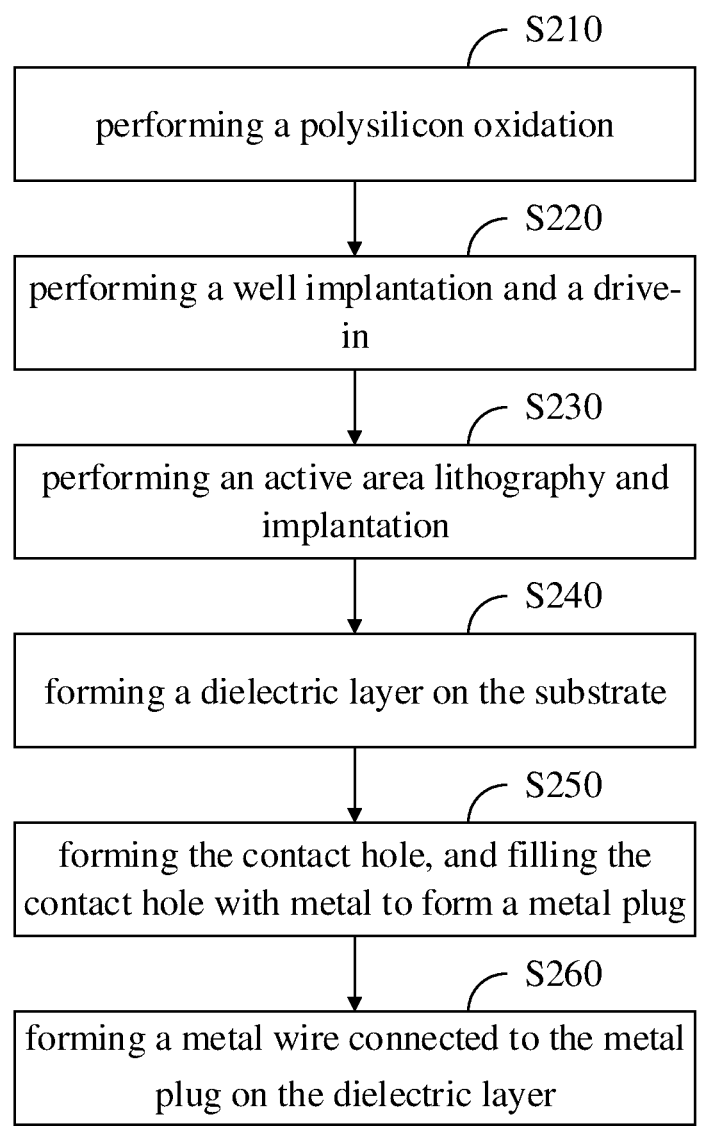
FIG. 4 is a manufacturing flow chart of the device after step S180.

After step S180, the active area process, the dielectric layer process, the contact hole process, the metal interconnection process and the like can be implemented according to technologies in prior art. A specific embodiment shown in FIG. 4 is provided below:

In S210, a polysilicon oxidation is performed.

An oxide layer is formed on the surface of the polysilicon.

In S220, a well implantation and a drive-in are performed.

The barrier layer such as the insulating pad 20 has blocked places where the well implantation is not required, therefore the implantation can be directly perform without lithography.

In S230, an active area lithography and implantation is performed.

Figure 3L:
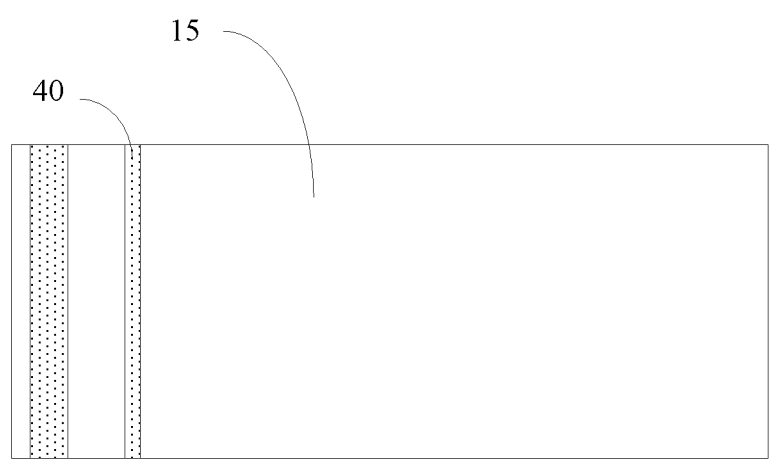

The photoresist 15 formed after lithography is shown in FIG. 3l.

In S240, a dielectric layer is formed on the substrate.

Figure 3M:
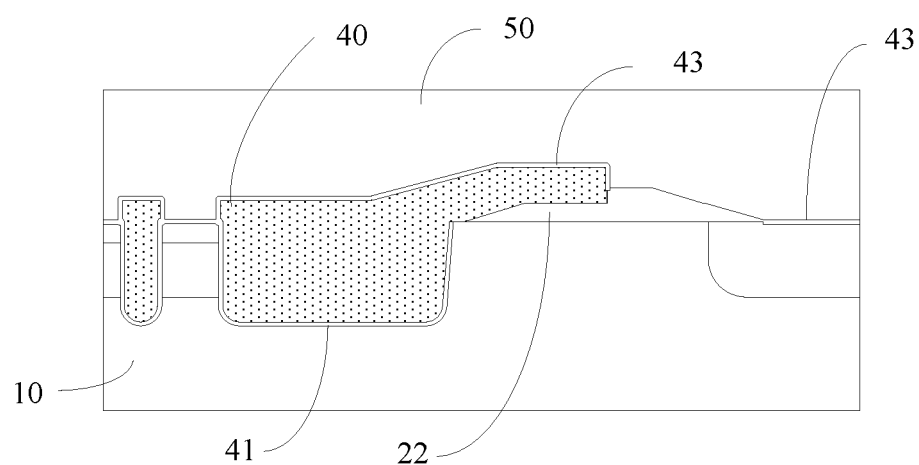

The cross-section view of the device after step S240 is shown in FIG. 3m. The dielectric layer 50 is an interlayer dielectric (ILD), which can be made of silicon dioxide, phosphosilicate glass (PSG)/boron-doped phosphosilicate glass (BPSG), silicon oxynitride, silicon nitride or the like, or a multilayer structure containing these materials.

In S250, a contact hole is formed, and a metal plug is formed by filling metal.

Figure 3N:
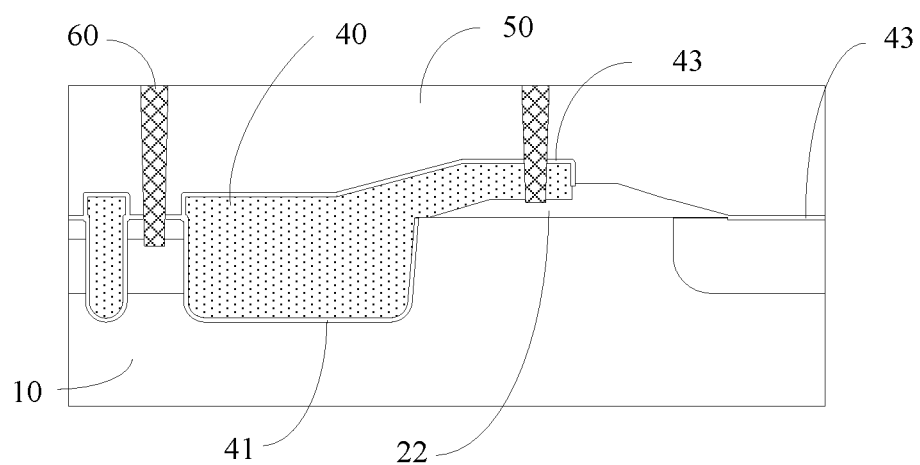

A contact hole is formed by etching the photoresist after lithography, the contact hole is filled with metal. The metal plug 60 inserts into the polysilicon gate 40 on the polysilicon gate pull-up area 22 to form an electrical connection. The cross-sectional view of the device after step S250 is shown in FIG. 3n. In the illustrated embodiment, the metal plug 60 is a tungsten plug. In other embodiments, other metal in the art can be used to fill the contact hole.

In S260, a metal wire that is connected to the metal plug is formed on the dielectric layer.

Figure 3O:
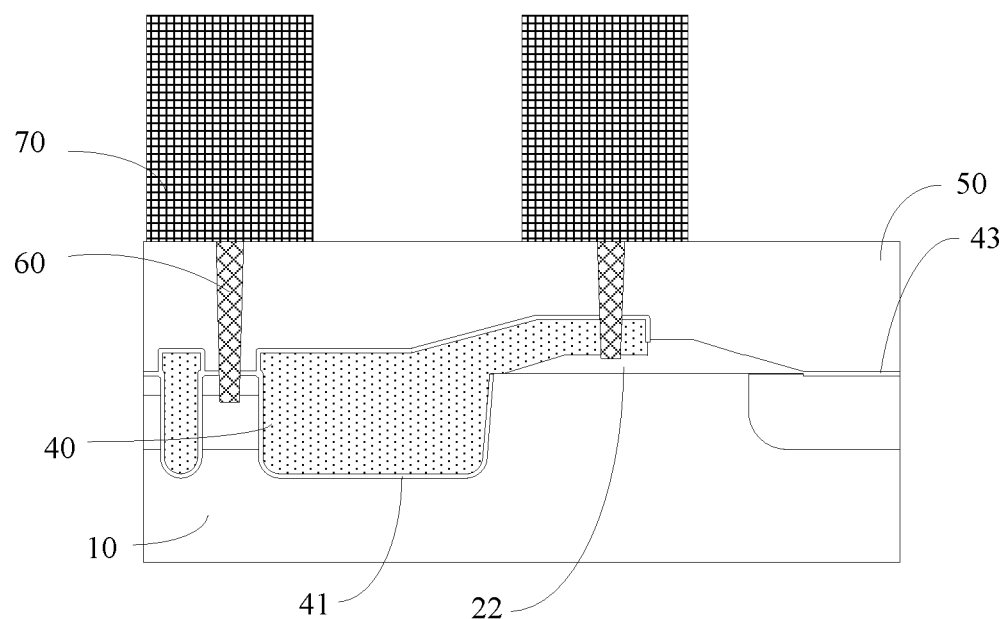

A metal is deposited on the dielectric layer, then a photoresist is photoetched and etched, the metal is subsequently alloyed. The cross-sectional view of the device after step S260 is shown in FIG. 3o. In the illustrated embodiment, the metal wire 70 is made of aluminum, in other embodiments, other metal with good conductivity can also be used.

In one of the embodiments, after the S150 and prior to the step S160, the method further includes a step of performing a trench sacrificial oxidation and forming a sacrificial oxide layer in an inner surface of the trench; and a step of peeling off the sacrificial oxide layer. The purpose of the sacrificial oxidation is to repair the defects formed during the dry etching of the trench in step S150, and to remove the surface contamination after the etching of the trench. Therefore, the surface condition of the trench before the step S160 is improved, so as to obtain a better oxidation quality during the gate oxidation.

The aforementioned method of manufacturing a trench gate structure is particularly suitable for a DMOS device (including VDMOS and LDMOS). It should be understood that the manufacturing method is also suitable for other semiconductor devices.

Figure 1:
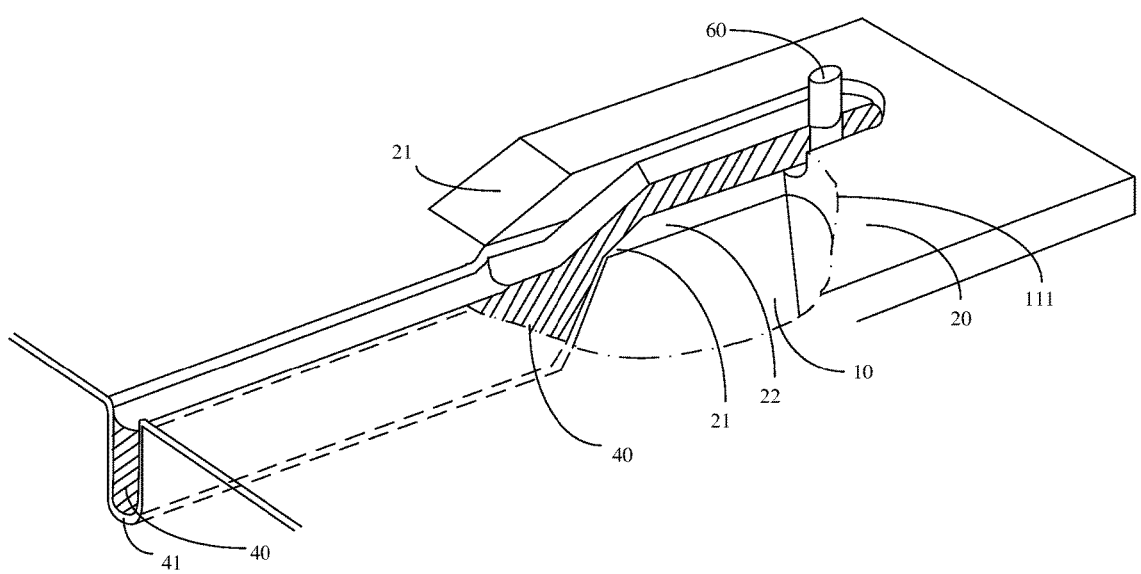
FIG. 1 is a perspective view of a trench gate structure according to an embodiment.

In a trench gate structure according to an embodiment, referring FIG. 3o and FIG. 1, a cross-sectional view is taken along the dash and dot line 111 in FIG. 1 to show an internal structure of the trench gate. The trench gate structure includes a substrate 10, a trench on a surface of the substrate 10, a gate oxide layer 41 on an inner surface of the trench, and a polysilicon gate 40 on the gate oxide layer 41. The insulating pad 20 is adjacent to the trench by the slope structure thereof, the polysilicon gate 40 extends onto the insulating pad 20 along the slope structure 21 from the trench, the insulating pad 20 includes a polysilicon gate pull-up area 22 that is recessed with respect to other portions of the pad, and the portion of polysilicon gate 40 extending out of the trench is in contact with the polysilicon gate pull-up area 22.

In one of the embodiments, a width of the slope structure 21 of the polysilicon gate pull-up area 22 is equal to a width of the trench. The direction of the width is perpendicular to an extending direction of the polysilicon gate 40.

In one of the embodiments, the insulating pad 20 is a field oxide layer. In other embodiments, the insulating pad 20 can also be made of other insulating materials in the art. The field oxide of the insulating pad 20 forms a separation between the contact hole and the substrate 10, and comparing to a conventional separation shown in FIG. 1 which is performed by a thin gate oxide layer on the surface of the substrate, the effect of separation is more reliable.

The aforementioned trench gate structure is particularly suitable for a DMOS device (including VDMOS and LDMOS). It should be understood that the trench gate structure is also suitable for other semiconductor devices with trench gate structure.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

What is claimed is:

1. A method of manufacturing a trench gate structure, comprising:
    forming an insulating pad on a surface of a substrate, wherein the insulating pad forms a slope structure at an end thereof;
    forming a hard mask on surfaces of the substrate and the insulating pad;
    performing lithography using a photoresist to form a polysilicon gate opening;
    etching an exposed hard mask by the opening, wherein the insulating pad forms a polysilicon gate pull-up area corresponding to the opening due to an over-etching of the hard mask, and the polysilicon gate pull-up area is recessed with respect to other portions of the insulating pad;
    etching an exposed substrate by the opening to form a trench; wherein the insulating pad is adjacent to the trench by the slope structure;
    performing a gate oxide oxidation, and forming a gate oxide layer on an inner surface of the trench;
    depositing polysilicon in the trench to form a polysilicon gate, wherein the polysilicon gate extends from an inside of the trench onto the polysilicon gate pull-up area and serves as an area that contacts a contact hole; and
    peeling off the hard mask.

2. The method according to claim 1, wherein after the step of peeling off the hard mask, the method further comprises:
    performing a polysilicon oxidation;
    performing a well implantation and a drive-in;
    performing an active area lithography and implantation;
    forming a dielectric layer on the substrate;
    forming the contact hole, and filling the contact hole with metal to form a metal plug;
    wherein the metal plug is inserted into the polysilicon gate above the polysilicon gate pull-up area; and
    forming a metal wire on the dielectric layer connected to the metal plug.

3. The method according to claim 1, wherein the step of forming an insulating pad on a surface of a substrate is performing an active area lithography and a wet etching after growing a field oxide layer.

4. The method according to claim 1, wherein after the step of forming a trench and prior to the step of performing a gate oxide oxidation, the method further comprises:
    performing a trench sacrificial oxidation to form a sacrificial oxide layer; and
    peeling off the sacrificial oxide layer.

5. The method according to claim 1, wherein after the step of depositing polysilicon in the trench, the polysilicon gate is formed by a polysilicon etching back.

6. The method according to claim 1, wherein the polysilicon gate opening comprises a metal plug contact opening configured to form a portion where the polysilicon gate contacts the metal plug, a main body opening configured to form a main body of the polysilicon gate, and a connecting opening connecting the metal plug contact opening and the main body opening, and the connecting opening is rectangular.

7. A trench gate structure, comprising:
    a substrate;
    a trench located on a surface of the substrate;
    a gate oxide layer located on an inner surface of the trench;
    an insulating pad located on the substrate, wherein the insulating pad is adjacent to the trench by a slope structure thereof, and the insulating pad comprises a polysilicon gate pull-up area that is recessed with respect to other portions of the insulating pad; and a polysilicon gate located on the gate oxide layer, wherein the polysilicon gate extends from an inside of the trench onto the insulating pad along the slope structure, and the polysilicon gate extends out of the trench and is in contact with the polysilicon gate pull-up area.

8. The trench gate structure according to claim 7, wherein a width of the slope structure of the polysilicon gate pull-up area is equal to a width of the trench, and directions of both widths are perpendicular to an extending direction of the polysilicon gate.

9. The trench gate structure according to claim 7, wherein the insulating pad is a field oxide layer.

10. The trench gate structure according to claim 7, wherein the trench gate structure is a trench gate structure of a vertically double diffused metal-oxide-semiconductor field-effect transistor or a laterally double diffused metal-oxide-semiconductor field-effect transistor.

\* \* \* \* \*